United States Patent
Nährig et al.

(10) Patent No.: US 11,823,988 B2
(45) Date of Patent: Nov. 21, 2023

(54) SEMICONDUCTOR MODULE COMPRISING A HOUSING

(71) Applicant: Siemens Aktiengesellschaft, Munich (DE)

(72) Inventors: Matthias Nährig, Bayern (DE); Jens Schmenger, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/913,705

(22) PCT Filed: Feb. 26, 2021

(86) PCT No.: PCT/EP2021/054833
§ 371 (c)(1),
(2) Date: Sep. 22, 2022

(87) PCT Pub. No.: WO2021/209186
PCT Pub. Date: Oct. 21, 2021

(65) Prior Publication Data
US 2023/0111324 A1  Apr. 13, 2023

(30) Foreign Application Priority Data
Apr. 17, 2020  (EP) .................................... 20170116

(51) Int. Cl.
*H01L 23/498* (2006.01)
*H01L 23/00* (2006.01)

(52) U.S. Cl.
CPC .. *H01L 23/49811* (2013.01); *H01L 23/49822* (2013.01); *H01L 24/32* (2013.01);
(Continued)

(58) Field of Classification Search
CPC ......... H01L 23/49811; H01L 23/49822; H01L 24/83; H01L 2224/32111; H01L 2224/48091; H01L 2224/831
See application file for complete search history.

(56) References Cited

U.S. PATENT DOCUMENTS

| 10,002,821 B1 * | 6/2018 | Hoegerl ................ H01L 23/051 |
| 10,581,426 B1 | 3/2020 | Lin et al. |

(Continued)

FOREIGN PATENT DOCUMENTS

| CN | 108811758 A | 5/2017 |
| DE | 102017207382 B4 | 1/2020 |

(Continued)

OTHER PUBLICATIONS

PCT International Search Report and Written Opinion of International Searching Authority dated Jun. 2, 2021 corresponding to PCT International Application No. PCT/EP2021/054833 filed Feb. 26, 2021.

*Primary Examiner* — Jasmine J Clark
(74) *Attorney, Agent, or Firm* — Henry M. Feiereisen LLC (57) ABSTRACT

A semiconductor module includes a housing, a pin arranged in the housing and including a first contact region which has a press-fit connection, a semiconductor component arranged in the housing and electrically conductively connected to the pin, and a first substrate arranged in the housing and clamped in the housing via the pin by a non-positive locking connection, which, when formed, causes the press-fit connection to be deformed elastically and/or plastically with the first substrate. The first substrate has a first recess which is open and at least in part encompasses the pin in the first contact region. A metallic coating is applied to the first substrate at least in a region of the first recess so as to electrically conductively connect the first substrate to the (Continued)

semiconductor component, and a second substrate is in contact with the pin and connected within the housing in a non-releasable manner.

20 Claims, 4 Drawing Sheets

(52) U.S. Cl.
CPC .............. *H01L 24/48* (2013.01); *H01L 24/83* (2013.01); *H01L 2224/32111* (2013.01); *H01L 2224/48091* (2013.01); *H01L 2224/831* (2013.01)

(56) References Cited

U.S. PATENT DOCUMENTS

| | | |
|---|---|---|
| 2009/0197439 A1 | 8/2009 | Nabilek et al. |
| 2012/0320545 A1 | 12/2012 | Nunzio et al. |
| 2017/0263527 A1* | 9/2017 | Mohn .................... H05K 1/115 |
| 2017/0330810 A1 | 11/2017 | Joko et al. |
| 2018/0241319 A1 | 8/2018 | Bando et al. |
| 2019/0189553 A1* | 6/2019 | Hohlfeld ........... H01L 23/49861 |

FOREIGN PATENT DOCUMENTS

| | | |
|---|---|---|
| EP | 1032042 A2 | 8/2000 |
| EP | 1624531 A1 | 2/2006 |
| EP | 2088084 A1 | 8/2009 |

\* cited by examiner

SEMICONDUCTOR MODULE COMPRISING A HOUSING

CROSS-REFERENCES TO RELATED APPLICATIONS

This application is the U.S. National Stage of International Application No. PCT/EP2021/054833, filed Feb. 26, 2021, which designated the United States and has been published as International Publication No. WO 2021/209186 A1 and which claims the priority of European Patent Application, Serial No. 20170116.6, filed Apr. 17, 2020, pursuant to 35 U.S.C. 119(a)-(d).

BACKGROUND OF THE INVENTION

The invention relates to a semiconductor module having a housing, at least one semiconductor component, a first substrate and a second substrate.

Moreover, the invention relates to a converter having at least one such semiconductor module.

Furthermore, the invention relates to a method for producing such a semiconductor module, wherein the first substrate is connected to the pin and subsequently the second substrate is connected to the same pin.

Semiconductor modules, in particular power modules, comprise in general semiconductor components, in particular power semiconductors, for example IGBTs (insulated-gate bipolar transistors), which are received in a housing and are connected to a ceramic substrate. The semiconductor module comprises moreover at least two further substrates, for example a main circuit board having an interface and a driver circuit board, which are in contact with the ceramic substrate. In order to provide the contact, separate contacts, called pins, are used, and the separate contacts are fastened in the housing or on the ceramic substrate. These contacts require installation space, as a result of which the size of the power module is influenced.

The patent specification DE 10 2017 207 382 B4 describes a semiconductor apparatus comprising a power apparatus; a sensor, which measures a physical state of the power apparatus in order to transmit a signal according to the physical state; a main electrode connection, through which flows a main current of the power apparatus; a sensor signal connection which is connected to the sensor in order to receive a signal from the sensor; a driver connection which receives a driver power in order to drive the power apparatus; and a housing having an open underside which receives the power apparatus, the sensor, the main electrode connection, the sensor signal connection and the driver connection, wherein the sensor signal connection and the driver connection both have a first connection and a second connection, which are provided remotely from an inner side wall surface of the housing, wherein the first and second connection are electrically connected to one another in order to form a double structure. The first connection has a length which renders it possible for a front end part thereof to protrude outward from an upper surface of the housing and inputs/outputs the signal and the driver power from/to the outside. The second connection has a length that does not allow a front end part thereof to protrude outward from the upper surface of the housing.

The unexamined patent application EP 2 086 064 A1 describes an electrical press-in contact, in particular a press-in pin contact, for transferring electrical current and/or electrical signals, having a press-in section and a mounting section which are mechanically coupled to one another via a strain relief section. The strain relief section has a compensating region and a stop region, wherein the compensating region allows a coupled relative movement of the press-in section and of the mounting section, and the stop region blocks a movement of the press-in section and the mounting section toward one another.

The unexamined patent application US 2018/0241319 A1 describes an electronic apparatus having a first substrate, a wiring substrate (second substrate) which is arranged above the first substrate, and a housing in which the first substrate and the wiring substrate are accommodated and which has a first side and a second side.

The unexamined patent application EP 1 032 042 A2 describes a power converter comprising a semiconductor module, which contains a power unit which consists of a power semiconductor and a control unit for controlling the power semiconductor, wherein the power unit comprises power semiconductor elements that are respectively adhered to a lead frame.

The unexamined patent application EP 1 624 531 A1 describes a press-in connector, for electrically conductively connecting printed circuit boards, with plug-in zones which are spaced apart from one another and are configured with cross sections and diameters that differ from one another.

The unexamined patent application CN 106 611 758 A describes an integrated housing structure for a power module that comprises a housing, a first circuit substrate, a second circuit substrate, a first pin, a second pin and a third pin, wherein the housing is provided with a hollow space; the second circuit substrate is arranged relatively above the first circuit substrate and the two circuit substrates are accommodated in the hollow space.3

The unexamined patent application U.S. Pat. No. 10,581, 426 B1 describes an electronic component comprising a first semiconductor chip having a first FET, whose drain is connected to a switching node, whose source is connected to a reference node and whose gate is connected to a first switching control node. The first chip also comprises a bipolar transistor which is connected as a diode and forms a temperature diode in addition to the first FET. The temperature diode comprises a cathode, which is connected to the reference node, and an anode, which is connected to a bias voltage node.

The object underlying the invention is to specify a semiconductor module which is more compact in comparison to the prior art.

SUMMARY OF THE INVENTION

The object is achieved in accordance with the invention by a semiconductor module having a housing, at least one semiconductor component, a first substrate and a second substrate, wherein at least the semiconductor component and the first substrate are arranged in the housing, wherein the semiconductor component is electrically conductively connected to at least one pin, wherein the at least one pin is in contact with the second substrate and is connected in a non-releasable manner within the housing, wherein the first substrate is connected via the at least one pin in a non-positive locking manner in the housing, wherein the non-positive locking connection is produced by clamping.

Moreover, the object is achieved in accordance with the invention by a converter having at least one such semiconductor module.

Furthermore, the object is achieved in accordance with the invention by a method for producing such a semiconductor module, wherein the first substrate is connected to the pin by clamping and subsequently the second substrate is connected to the same pin.

The advantages and preferred embodiments listed below in regard to the semiconductor module can be applied in a similar manner to the converter and the production method.

The invention is based on the consideration to save installation space in a semiconductor module which has a housing and in which a first substrate and a second substrate are to be contacted, in that at least one pin is used so as to electrically conductively contact a second substrate and, in an additional function, to connect a first substrate via the at least one pin in a non-positive locking manner in the housing. The expression "a non-positive locking connection via the at least one pin of the first substrate in the housing" is to be understood to mean that the first substrate is connected in a non-positive locking manner via at least one pin to the housing or to at least one further component which is in particular mechanically connected to the housing. The pin represents an electrically conductive connection to the semiconductor component and is connected within the housing in a non-releasable manner. A non-releasable connection is produced, for example, by casting, soldering or sintering. On account of the non-releasable connection of the pin in the housing, the first substrate is connected in a non-positive locking manner via the pin in the housing. The non-positive locking connection is produced, for example, by clamping. As a result of such an arrangement, the number of connecting means, for example screws and/or further pins, is reduced and installation space is saved. The first substrate and the second substrate are produced, for example, from a fiberglass reinforced epoxy resin, in particular FR4, and have, for example, on both sides an at least in part structured metal coating, in particular a surface metal coating. At least the first substrate is arranged together with the semiconductor component in the housing, which further saves installation space. During installation, the first substrate is initially connected in a non-positive locking manner via the pin, whereupon the second substrate is connected to the same pin. Such a production method can be realized in a simple and cost-effective manner.

Particularly advantageously, the pin is oversized with an elastically and/or plastically yielding region in a first contact region with the first substrate so as to produce the non-positive locking connection. An oversizing is, for example, a thickening, in particular a stamping. If the region is designed in a primarily elastically yielding manner, the non-positive connection is reversible. The substrate can be connected in a simple manner in the housing on account of a first contact region that is configured in such a manner.

In the case of a further embodiment, the first substrate has a first recess which at least in part encompasses the pin. The recess is configured as a closed recess, which completely encompasses the pin, or as an open or opened recess which encompasses the pin in part. A contour of the recess is rounded or has at least one corner. In addition to the non-positive locking connection, such a recess achieves a form fit which results in a mechanically more stable connection.

Particularly advantageously, the first substrate has at least in the region of the first recess a metal coating, with the result that the first substrate is electrically conductively connected to the semiconductor component. Such a connection does not require an additional work step in particular in comparison to soldering.

A further embodiment provides that the metal coated first recess is configured as an open recess which encompasses the pin in part, in particular by a maximum of half, in the first contact region. Such a recess is in particular arranged on the edge of the first substrate or on the edge of a groove of the first substrate, where, for example, none of the components that are to be fitted, in particular SMD components, are arranged, with the result that it is not necessary to provide additional space for the first recess. Such an open recess therefore saves space.

In the case of a further embodiment, the metal coated first recess is configured as a bore segment. Such bore segments can be produced in a simple and cost-effective manner.

A further embodiment provides that the pin is arranged in the metal coated first recess in such a manner that an essentially linear pressure distribution is provided. Such a pressure distribution is sufficient for the non-positive locking connection, in particular clamping, of the first substrate and can be produced in a simple and cost-effective manner.

In the case of a further embodiment, the second substrate has a metal coated second recess via which the pin is electrically conductively connected in a non-positive locking and/or a material-bonded manner to the second substrate, A non-positive locking connection can be produced, for example, by a press-in connection, and a material-bonded connection can be produced, for example, by soldering. According to experience, such connections have proven to be advantageous.

A further embodiment provides that a diameter of the second recess is smaller than a diameter of the first recess. For example, during the manufacture of the semiconductor module, initially the first substrate having the larger first recess is moved over the second contact region of the pin, without coming into contact with the pin, and is connected in a non-positive locking manner in the region of the first contact region. Subsequently, the second substrate having the smaller second recess is connected in the second contact region of the same pin. On account of the different diameters, two substrates can be connected in a simple and cost-effective manner to the same pin.

In the case of a further embodiment, the second substrate is connected via the at least one pin in an electrically conductive manner to the semiconductor component. In this manner, the semiconductor component can be connected in a space-saving manner to two substrates.

A further embodiment provides that the pin is configured as a free-standing pin and has an elastic section. Such a free-standing pin is arranged outside the housing, which encompasses, for example, a ceramic substrate, and said pin can be positioned freely on the ceramic substrate. The elastic section compensates for thermal loadings, in particular thermal lengthening, and in so doing contributes to the mechanical stability.

In the case of a further embodiment, the pin is arranged extending at least in part in the housing. For example, the pin is cast at least in part into the housing. According to experience, such an arrangement has proven to be advantageous.

A further embodiment provides that the semiconductor module comprises a sensor which has at least one sensor connection, wherein the semiconductor component comprises at least one driver connection and wherein at least one sensor connection and at least one driver connection are electrically conductively connected to one another via a common pin. The sensor is configured, for example, as a temperature sensor which is thermally connected to the semiconductor component. For example, a driver connection, in particular an emitter connection, and a sensor connection are connected to a common reference potential, in particular to a negative supply voltage of the semiconductor component. Alternatively, a common pin is used by way of a frequency multiplex method, wherein the driver connection is operated in a first frequency range and the sensor connection is operated in a second frequency range. Such a common pin saves installation space in the semiconductor module.

BRIEF DESCRIPTION OF THE DRAWING

The invention is further described and explained below with the aid of the exemplary embodiments that are illustrated in the figures.

In the drawings.

DETAILED DESCRIPTION OF PREFERRED EMBODIMENTS

The exemplary embodiments explained below are preferred embodiments of the invention. In the case of the exemplary embodiments, the described components of the embodiments each represent individual features of the invention that are to be considered independently of one another and which each also develop the invention independently of one another and consequently are also to be regarded individually or in a combination other than the illustrated combination as a component of the invention. Furthermore, the described embodiments can also be supplemented by further features of the invention that have already been described.

Identical reference characters have the same meaning in the different figures.

Figure 1:
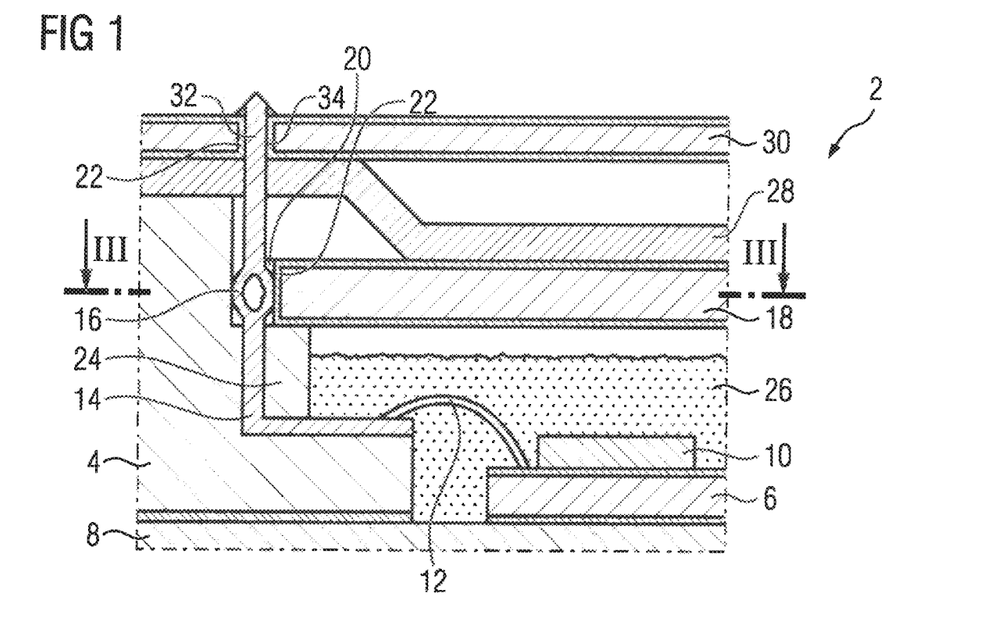
FIG. 1 shows a schematic cross-sectional view of a section of a first embodiment of a semiconductor module.

FIG. 1 illustrates a schematic cross-sectional view of a section of a first embodiment of a semiconductor module 2 which has a housing 4 that is manufactured from a synthetic material. The housing 4 has an open underside and encompasses a DCB ceramic substrate 6 which comprises, for example, aluminum oxide and/or aluminum nitride and has on both sides an at least in part structured metal coating which comprises, for example, copper. The housing 4 and the DCB ceramic substrate 6 lie on a metal base plate 8 and are connected thereto in particular in a material-bonded manner. The base plate 8 is configured in particular as a cooling body, which comprises, for example, aluminum and/or copper, wherein the metal coating of the DCB ceramic substrate 6, said coating facing the base plate 8, is electrically and thermally conductively connected to the base plate 8. On the metal coating of the DCB ceramic substrate 6, said coating being remote from the base plate 8, a semiconductor component 10 is connected in a material-bonded manner to the metal coating of the DCB ceramic substrate 6. The semiconductor component 10 is electrically conductively connected via a bond wire 12 to a pin 14 which is embedded in the housing 4. The pin 14 is oversized with an elastically and/or plastically yielding region in a first contact region 16, wherein the first contact region 16 protrudes out of the housing 4. The pin 14 has a press-fit connection, for example, in the first contact region 16. A first substrate 18 which comprises, for example, at least one driver circuit, signal processing and/or a snubber circuit, is connected in a non-positive locking manner via the pin 14 in the housing by clamping, wherein the pin 14 is deformed in an elastic and/or plastic manner in the first contact region 16. The first substrate 18 has a first recess 20 in which the pin 14 is received in part. Furthermore, the first substrate 18 has on both sides an at least in part structured metal coating, in particular a surface metal coating, and said first substrate is produced from a fiberglass reinforced epoxy resin, in particular FR4. In the region of the first recess 20, the first substrate 18 has a vertical metal coating 22 which is electrically conductively connected to the surface metal coating, with the result that the first substrate 18 is electrically conductively connected to the semiconductor component 12 via the pin 14. In particular, the metal coated first recess 20 encompasses the pin 14, in particular by a maximum of half, in the first contact region 16, wherein the first recess 20 is configured, for example, as a bore segment. Alternatively, the first recess 20 is milled and/or has at least one corner. On at least an opposite-lying side of the semiconductor module 2, which is not illustrated for reasons of clarity, the first substrate 18 is contacted via at least one further pin 14 or via the housing 4 itself so as to produce the non-positive locking connection.

Furthermore, essentially directly below the first contact region 16, the housing 4 has a contact surface 24, with the result that the first substrate 18 lies in an essentially horizontal manner on the housing 4. Below the contact surface 24, the semiconductor module 2 comprises a casting mass 26 which encompasses the semiconductor component 10 and the bond wire 12. A cover 28 which is produced, for example, from a synthetic material is arranged on the first substrate 18, wherein the first substrate 18 is pressed optionally through the cover 28 onto the housing 4. The pin 14 extends outside the housing 4 through the cover 28 and a second substrate 30, wherein the second substrate 30 has on both sides an at least in part structured metal coating, in particular surface metal coating, and is produced from a fiberglass reinforced epoxy resin, in particular FR4. The pin 14 is received in a second contact region 32 in an, in particular cylindrical, second recess 34 which completely encompasses the pin 14. In the region of the second recess 34, the second substrate 30 has a vertical metal coating 22 which is electrically conductively connected to the surface metal coating. In particular, the vertical metal coating 22 completely covers the cylindrical first recess 20. Alternatively, the recess 20 has a square or other shape.

The pin 14 is electrically and mechanically connected to the metal coating of the second substrate 30, for example, in a material-bonded manner via a solder connection, with the result that the second substrate 30 is electrically conductively connected to the semiconductor component 10 via the pin 14. The second substrate 30 which has for example an interface and/or a controller is fixed to the pin 14 in the semiconductor module 2 via the connection. Optionally, the second substrate 30 is connected to the housing 4 via further attachment means, for example screws, which are not illustrated for reasons of clarity.

Figure 2:
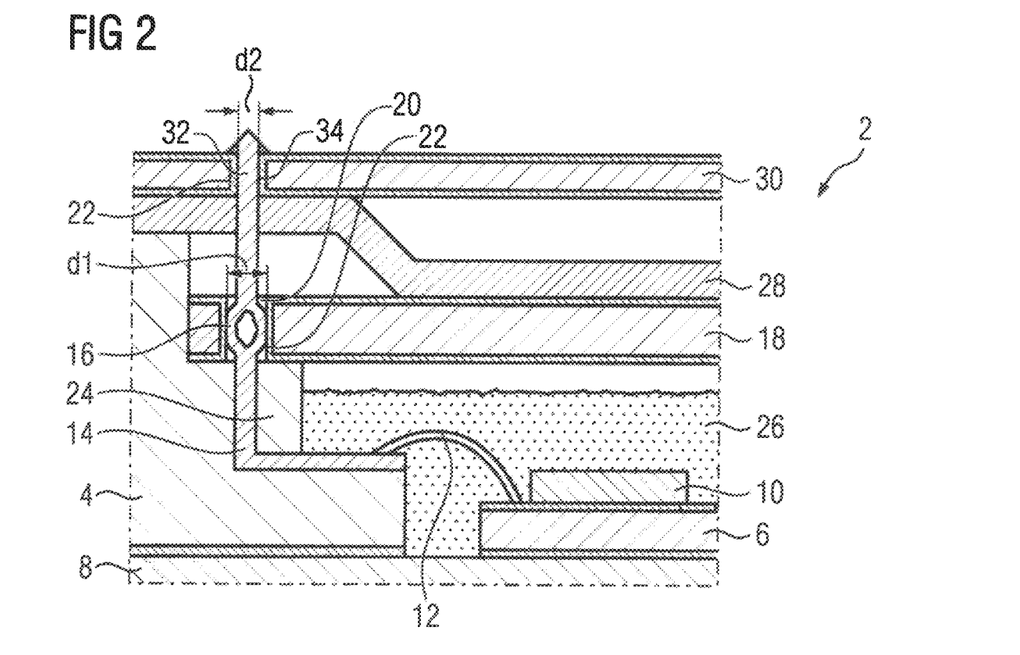
FIG. 2 shows a schematic cross-sectional view of a section of a second embodiment of a semiconductor module.

FIG. 2 illustrates a schematic cross-sectional view of a section of a second embodiment of a semiconductor module 2. The first substrate 18 has on both sides an at least in part structured metal coating, in particular surface metal coating, and an, in particular cylindrical, first recess 20 that completely encompasses the pin 14 in a first contact region 16. In the region of the first recess 20, the first substrate 18 has a vertical metal coating 22 which is electrically conductively connected to the surface metal coating. In particular, the vertical metal coating 22 completely covers the cylindrical first recess 20. In the first contact region 16, the pin 14 is oversized with an elastically and/or plastically yielding region which is configured by way of example as a press-fit connection. By pressing in the first substrate 18, the pin 14 is elastically and/or plastically deformed in the first contact region 16.

A first diameter d1 of the first recess 20 is larger than a second diameter d2 of the second recess 34, with the result that during the manufacture of the semiconductor module 2 initially the first substrate 18 having the first recess 20 is moved over the second contact region 32 of the pin 14 and is connected in a non-positive locking manner in the region of the first contact region 16. Subsequently, the cover 28 is placed on and the second substrate 30 is connected to the pin 14. The further embodiment of the semiconductor module 2 in FIG. 2 corresponds to the embodiment in FIG. 1.

Figure 3:
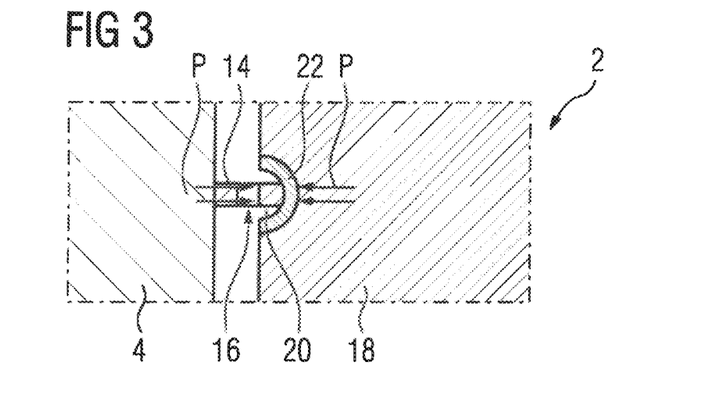
FIG. 3 shows an enlarged longitudinal sectional view of the first embodiment of a semiconductor module in the first contact region.

FIG. 3 illustrates an enlarged longitudinal sectional view of the first embodiment of a semiconductor module 2 in the first contact region 16. The pin 14 is arranged in the metal coated first recess 20 and is connected in a non-positive locking manner to the first substrate 18 in such a manner that an essentially linear pressure distribution P is provided. Optionally, the pin 14 contacts the housing 4 so as to form the non-positive locking connection. The further embodiment of the semiconductor module 2 in FIG. 3 corresponds to the embodiment in FIG. 1.

Figure 4:
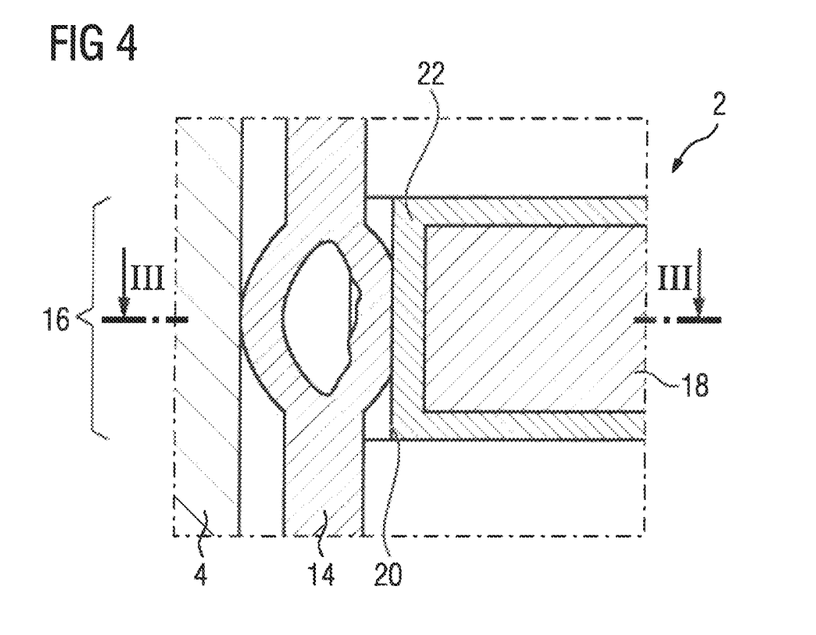
FIG. 4 shows an enlarged cross-sectional view of the first embodiment of the semiconductor module in the first contact region.

FIG. 4 illustrates an enlarged cross-sectional view of the first embodiment of a semiconductor module 2 in the first contact region 16, wherein the pin 14 has a press-fit connection which is deformed in an elastic and/or plastic manner as the non-positive locking connection to the first substrate 18 is formed. The further embodiment of the semiconductor module 2 in FIG. 4 corresponds to the embodiment in FIG. 1.

Figure 5:
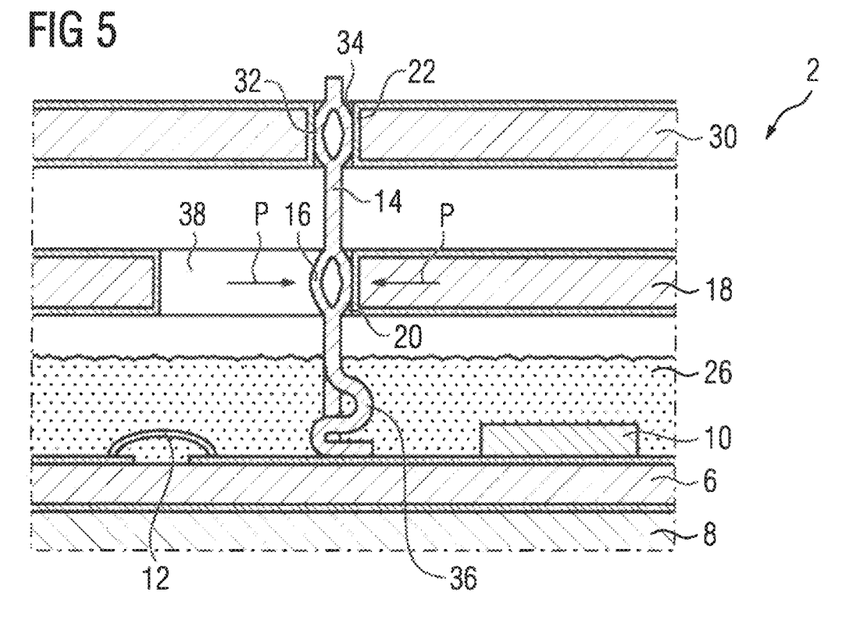
FIG. 5 shows a schematic cross-sectional view of a section of a third embodiment of a semiconductor module.

FIG. 5 illustrates a schematic cross-sectional view of a section of a third embodiment of a semiconductor module 2, wherein the pin 14 is configured as a free-standing press-in contact having a first contact region 16 and a second contact region 32 and wherein in the second contact region 32 the pin 14 has a press-fit connection which is connected in a non-positive locking manner to the second recess 34 of the second substrate 30. The free-standing pin 14 is arranged outside the housing 4, which encompasses the DCB ceramic substrate 6, and can be freely positioned on the DCB ceramic substrate 6. Furthermore, the pin 14 has an elastic section 36 and is connected in a material-bonded manner, in particular by soldering or sintering, to the metal coating of the DCB ceramic substrate 6, said metal coating being remote from the base plate 8.

The first substrate 18 has an, in particular square, groove 38 having a metal coating 22 that extends at least in part in the vertical direction. In the first contact region 16, the pin 14 is oversized with an elastically and/or plastically yielding region that is embodied, for example, as a press-fit connection. The first substrate 18 has in the groove 38 at least one first recess 20 in which the vertical metal coating 22 is provided and is electrically conductively connected to the surface metal coating. For example, the second substrate 30 can be connected directly to the DCB ceramic substrate 6 via the groove 38. The pin 14 is received in part in the first recess 20 and is connected thereto in a non-positive locking manner, with the result that the first substrate 18 is electrically conductively connected to the semiconductor component 12 by the pin 14. In particular, the metal coated first recess 20 encompasses the pin 14 by a maximum of half in the first contact region 16, wherein the first recess 20 is configured, for example, as a bore segment. Alternatively, the first recess 20 is milled with at least one corner. The pin 14 is arranged in the metal coated first recess 20 and connected to the first substrate 18 in a non-positive locking manner in such a manner that an essentially linear pressure distribution P is provided. The further embodiment of the semiconductor module 2 in FIG. 5 corresponds to the embodiment in FIG. 1.

Figure 6:
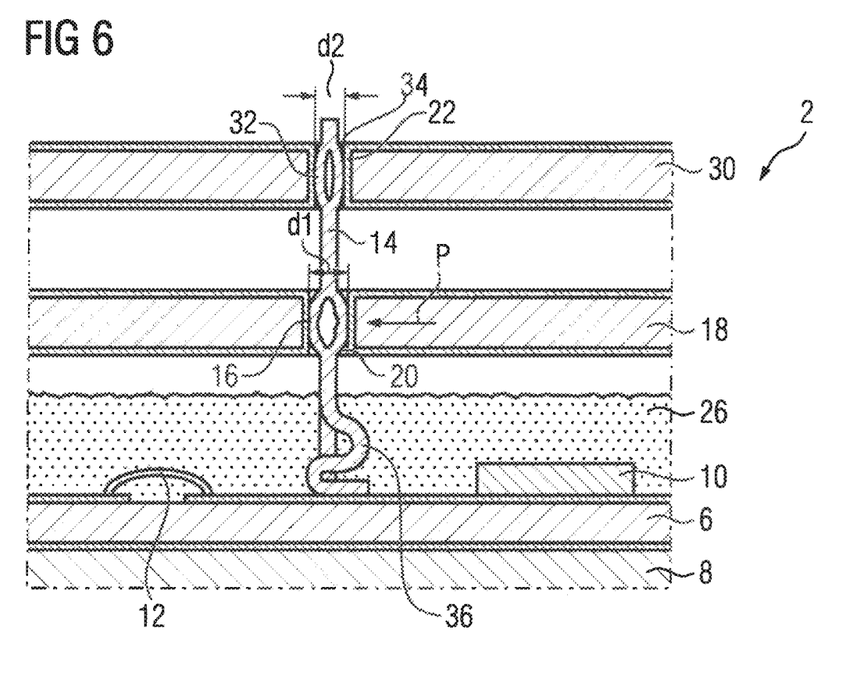
FIG. 6 shows a schematic cross-sectional view of a section of a fourth embodiment of a semiconductor module.

FIG. 6 illustrates a schematic cross-sectional view of a section of a fourth embodiment of a semiconductor module 2. The first substrate 18 has on both sides an at least in part structured metal coating, in particular a surface metal coating, and an, in particular cylindrical, first recess 20 which completely encompasses the pin 14 in a first contact region 16. The pin 14 is connected to the first substrate 18 in a non-positive locking manner, as a result of which the pin 14 is elastically and/or plastically deformed in the first contact region 16. A first diameter d1 of the first recess 20 is larger than a second diameter d2 of the second recess 34, with the result that during the manufacture of the semiconductor module 2 initially the first substrate 18 having the larger first recess 20 is moved over the second contact region 32 of the pin 14 and is connected in a non-positive locking manner in the region of the first contact region 16. Subsequently, the second substrate 30 is connected to the smaller second recess 34 in the second contact region 32 of the same pin 14. The further embodiment of the semiconductor module 2 in FIG. 6 corresponds to the embodiment in FIG. 5.

Figure 7:
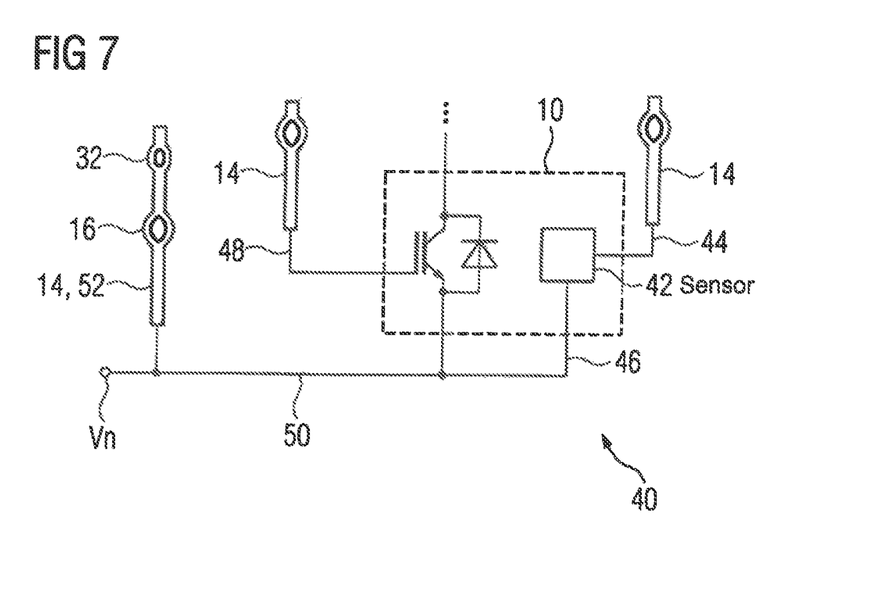
FIG. 7 shows a schematic view of a part of a circuit of the semiconductor module and FIG. 8 shows a schematic view of a converter having a semiconductor module.

FIG. 7 illustrates a schematic view of a part of a circuit 40 of the semiconductor module 2 which has a semiconductor component 10, which is configured as an IGBT, having a sensor 42. Alternatively, the sensor 42 is arranged outside the semiconductor component 10 and is connected to the semiconductor component 10. For example, the sensor 42 is configured as a temperature sensor which is thermally connected to the semiconductor component 10. The sensor has a first sensor connection 44 and a second sensor connection 46. The semiconductor component 10 has a first driver connection 48 and a second driver connection 50, wherein the second sensor connection 46 and the second driver connection 50 are in a short circuit and are connected to an, in particular negative, supply voltage Vn of the semiconductor component 10. A pin 14 is allocated to the first sensor connection 44 and the first driver connection 48 respectively, wherein for example the pin 14 of the first driver connection 48 is shorter than the pin 14 of the first sensor connection 44, with the result that the first driver connection 48 can be connected to the first substrate 18 and the first sensor connection 44 can be connected to the second substrate 30. The connections 46, 50 in a short circuit are connected to a common pin 52 which has a first contact region 16 so as to connect to the first substrate 18 or has a second contact region 32 so as to connect to the second substrate 30. The pins 14, 52 are illustrated in a symbolically abstracted manner in FIG. 7, wherein the common pin 52, as illustrated in the FIGS. 1 to 4, can be configured as a pin 14 that is integrated at least in part in the housing 4 or, as illustrated in the FIGS. 5 to 6, said pin can be configured as a free-standing pin 14.

Figure 8:
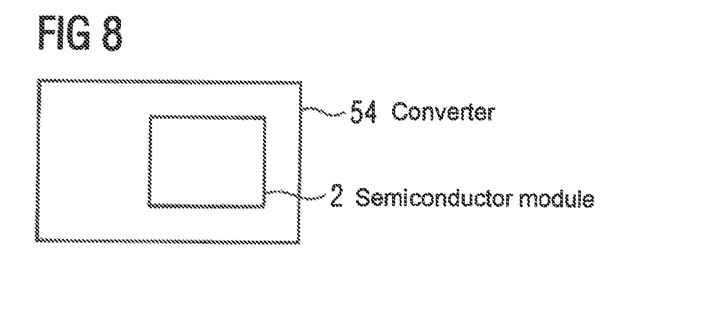

FIG. 8 illustrates a schematic view of a converter 54 having a semiconductor module 2. Depending upon the architecture, the converter 54 has at least one further semiconductor module 2.

Summarizing, the invention relates to a semiconductor module 2 having a housing 4, at least one semiconductor component 10, a first substrate 18 and a second substrate 30. In order to specify a semiconductor module 2 which is more compact in comparison to the prior art it is proposed that at least the semiconductor component 10 and the first substrate 18 are arranged in the housing 4, wherein the semiconductor component 10 is electrically conductively connected to at least one pin 14, wherein the at least one pin 14 is in contact with the second substrate 18 and is connected within the housing 4 in a non-releasable manner, wherein the first substrate 18 is connected via the at least one pin 14 in a non-positive locking manner in the housing 4.

What is claimed is:

1. A semiconductor module, comprising:
a housing;
a pin arranged in the housing and including a first contact region which has a press-fit connection;
a semiconductor component arranged in the housing and electrically conductively connected to the pin;
a first substrate arranged in the housing and clamped in the housing via the pin by a non-positive locking connection, which, when formed, causes the press-fit connection to be deformed elastically and/or plastically with the first substrate, said first substrate having a first recess which is open and at least in part encompasses the pin in the first contact region;
a metallic coating applied to the first substrate at least in a region of the first recess so as to electrically conductively connect the first substrate to the semiconductor component; and
a second substrate in contact with the pin and connected within the housing in a non-releasable manner.

2. The semiconductor module of claim 1, wherein the pin is configured in the first contact region with the first substrate in an oversized manner with an elastically and/or plastically yielding region so as to produce the non-positive locking connection.

3. The semiconductor module of claim 1, wherein the first recess is configured to encompass the pin by a maximum of half in the first contact region.

4. The semiconductor module of claim 1, wherein the pin is arranged in the first recess in such a manner that an essentially one-directional pressure distribution is provided.

5. The semiconductor module of claim 1, wherein the first recess is configured as a bore segment.

6. The semiconductor module of claim 1, wherein the second substrate has a metal-coated second recess and the pin is electrically conductively connected in a non-positive locking and/or material-bonded manner to the second substrate.

7. The semiconductor module of claim 6, wherein the second recess has a diameter which is smaller than a diameter of the first recess.

8. The semiconductor module of claim 1, wherein the second substrate is electrically conductively connected to the semiconductor component via the pin.

9. The semiconductor module of claim 1, wherein the pin includes an elastic section.

10. The semiconductor module of claim 1, wherein the pin is arranged such as to extend at least in part into the housing.

11. The semiconductor module of claim 1, wherein the semiconductor component includes a driver connection, and further comprising:
a sensor having a sensor connection; and
a common pin configured to electrically conductively connect the sensor connection and the driver connection.

12. A converter, comprising a semiconductor module, said semiconductor module comprising a housing, a pin arranged in the housing and including a first contact region which has a press-fit connection, a semiconductor component arranged in the housing and electrically conductively connected to the pin, a first substrate arranged in the housing and clamped in the housing via the pin by a non-positive locking connection, which, when formed, causes the press-fit connection to be deformed elastically and/or plastically with the first substrate, said first substrate having a first recess which is open and at least in part encompasses the pin in the first contact region, a metallic coating applied to the first substrate at least in a region of the first recess so as to electrically conductively connect the first substrate to the semiconductor component, and a second substrate in contact with the pin and connected within the housing in a non-releasable manner.

13. A method for producing a semiconductor module, said method comprising:
connecting a first substrate in a non-positive locking manner to a pin by clamping in a housing; and
subsequently connecting a second substrate to the pin.

14. The method of claim 13, further comprising:
arranging a semiconductor component in the housing and electrically conductively connecting the semiconductor component to the pin;
applying a metallic coating to the first substrate at least in a region of a first recess of the first substrate so as to electrically conductively connect the first substrate to the semiconductor component; and
connecting the second substrate within the housing in a non-releasable manner.

15. The method of claim 13, further comprising oversizing the pin hi a first contact region with the first substrate with an elastically and/or plastically yielding region so as to produce the non-positive locking connection.

16. The method of claim 15, further comprising configuring the first recess to encompass the pin by a maximum of half in the first contact region.

17. The method of claim 14, further comprising arranging the pin in the first recess in such a manner that an essentially linear one-directional pressure distribution is provided.

18. The method of claim 13, further comprising applying a metal coating to the second substrate in a region of a second recess of the second substrate for electrically conductively connecting the pin in a non-positive locking and/or material-bonded manner to the second substrate.

19. The method of claim 14, further comprising electrically conductively connecting the second substrate to the semiconductor component via the pin.

20. The method of claim 13, further comprising arranging the pin such as to extend at least in part into the housing.

* * * * *

UNITED STATES PATENT AND TRADEMARK OFFICE
CERTIFICATE OF CORRECTION

| | | |
|---|---|---|
| PATENT NO. | : 11,823,988 B2 | Page 1 of 1 |
| APPLICATION NO. | : 17/913705 | |
| DATED | : November 21, 2023 | |
| INVENTOR(S) | : Matthias Nährig and Jens Schmenger | |

It is certified that error appears in the above-identified patent and that said Letters Patent is hereby corrected as shown below:

On the Title Page

Under item (72) "Inventors": replace the first inventor's place of residence with --Hemhofen, Bayern--;

Under item (56) FOREIGN PATENT DOCUMENTS: replace "CN 108811758" with --CN 106611558--;

On page 2
Under item (56) FOREIGN PATENT DOCUMENTS: replace "EP 2088084" with --EP 2086064--;

In the Claims

In Column 10, Claim 15, Line 45: replace "hi" with --in--.

Signed and Sealed this
Twenty-fourth Day of September, 2024

Katherine Kelly Vidal
*Director of the United States Patent and Trademark Office*